(12) United States Patent
Liao et al.

(10) Patent No.: US 12,127,368 B2
(45) Date of Patent: Oct. 22, 2024

(54) HEAT DISSIPATION DEVICE OF SERVER CABINET

(71) Applicant: LDC Precision Engineering CO., Ltd., New Taipei (TW)

(72) Inventors: Feng-Shih Liao, New Taipei (TW); Chih-Wei Chen, New Taipei (TW); Wu-Hsiung Liu, New Taipei (TW)

(73) Assignee: LDC Precision Engineering CO., Ltd., New Taipei (TW)

( * ) Notice: Subject to any disclaimer, the term of this patent is extended or adjusted under 35 U.S.C. 154(b) by 191 days.

(21) Appl. No.: 17/964,752

(22) Filed: Oct. 12, 2022

(65) Prior Publication Data

US 2023/0126928 A1    Apr. 27, 2023

(30) Foreign Application Priority Data

Oct. 22, 2021    (TW) ................................ 110139282

(51) Int. Cl.
*H05K 7/20*        (2006.01)
(52) U.S. Cl.
CPC ..... *H05K 7/20145* (2013.01); *H05K 7/20172* (2013.01); *H05K 7/20272* (2013.01)
(58) Field of Classification Search
CPC ........... H05K 7/20145; H05K 7/20172; H05K 7/20272; H05K 7/20218; H05K 7/20763; F25B 39/04; F25B 2339/041; F25B 2400/075; F25B 7/00; F25B 9/008; F28C 1/14; F28D 3/02; F28D 5/00; F28D 1/0477; F28D 1/0426; F28F 2250/08; F28F 9/001; F28F 9/262; H01L 23/473
See application file for complete search history.

(56) References Cited

U.S. PATENT DOCUMENTS

| | | | |
|---|---|---|---|
| 8,105,439 B2* | 1/2012 | Liu | F24F 5/0035 134/17 |
| 2014/0262147 A1* | 9/2014 | Pawlick | F28D 1/024 165/67 |
| 2018/0132386 A1* | 5/2018 | Tung | H05K 7/20263 |
| 2020/0275584 A1* | 8/2020 | Chiang | H05K 7/20772 |

* cited by examiner

*Primary Examiner* — Michael A Matey
(74) *Attorney, Agent, or Firm* — Chun-Ming Shih; LANWAY IPR SERVICES (57) ABSTRACT

A heat dissipation device of server cabinet heat dissipation device of server cabinet, comprising an outer case and a plurality of heat dissipation devices, the outer case is provided with a plurality of vents on one side, and a plurality of fans are installed on the other side, each of the heat dissipation devices is installed in the outer case, and each of the heat dissipation devices has an included angle toward each of the vents or the directions of the fans, so that the wind can pass through continuously after the fans are activated. Each of the heat dissipation devices is directly discharged after that. Since the heat dissipation devices do not overlap on the air circulation path, even if there is more than one heat dissipation device, it can still ensure that there is no temperature difference between each air, so that the heat dissipation effect is better so as the effect of stabilizing the overall heat dissipation temperature.

9 Claims, 10 Drawing Sheets

HEAT DISSIPATION DEVICE OF SERVER CABINET

BACKGROUND OF THE INVENTION

1. Field of the Invention

The present invention relates to a heat dissipation device of server cabinet, which is a device installed in the server cabinet for emitting heat.

2. Description of Related Art

The era of big data and the internet has come along with the network technology progress rapidly, so that the demand for cloud services has increased rapidly in recent years. The computing processing capabilities of electronic computing devices used in cloud services must be enlarged and enchanted with it, therefore the heat energy generated by the electronic computing device will be increased.

Figure 1:
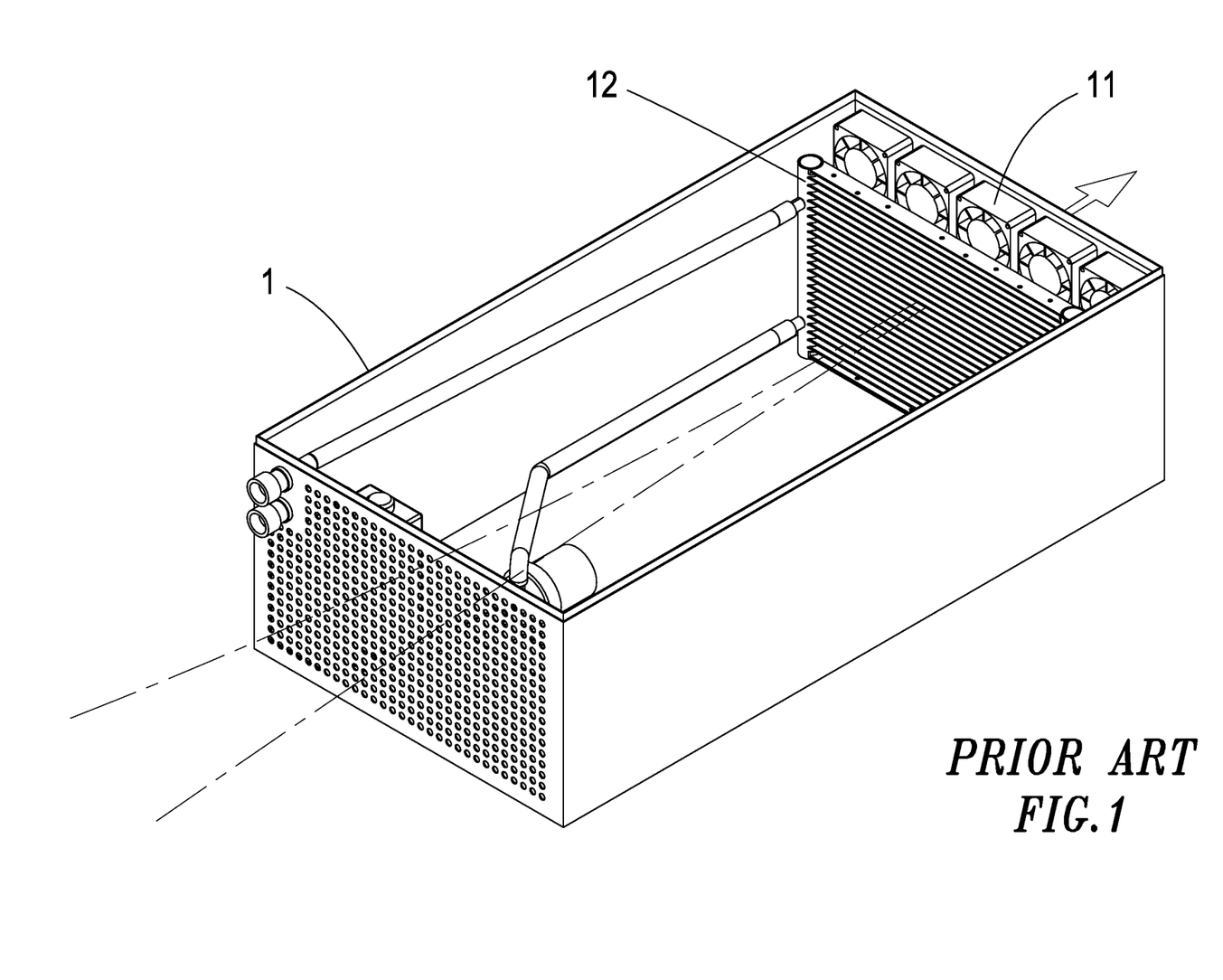
FIG. 1 is a perspective view of a conventional heat dissipation device.
Figure 2:
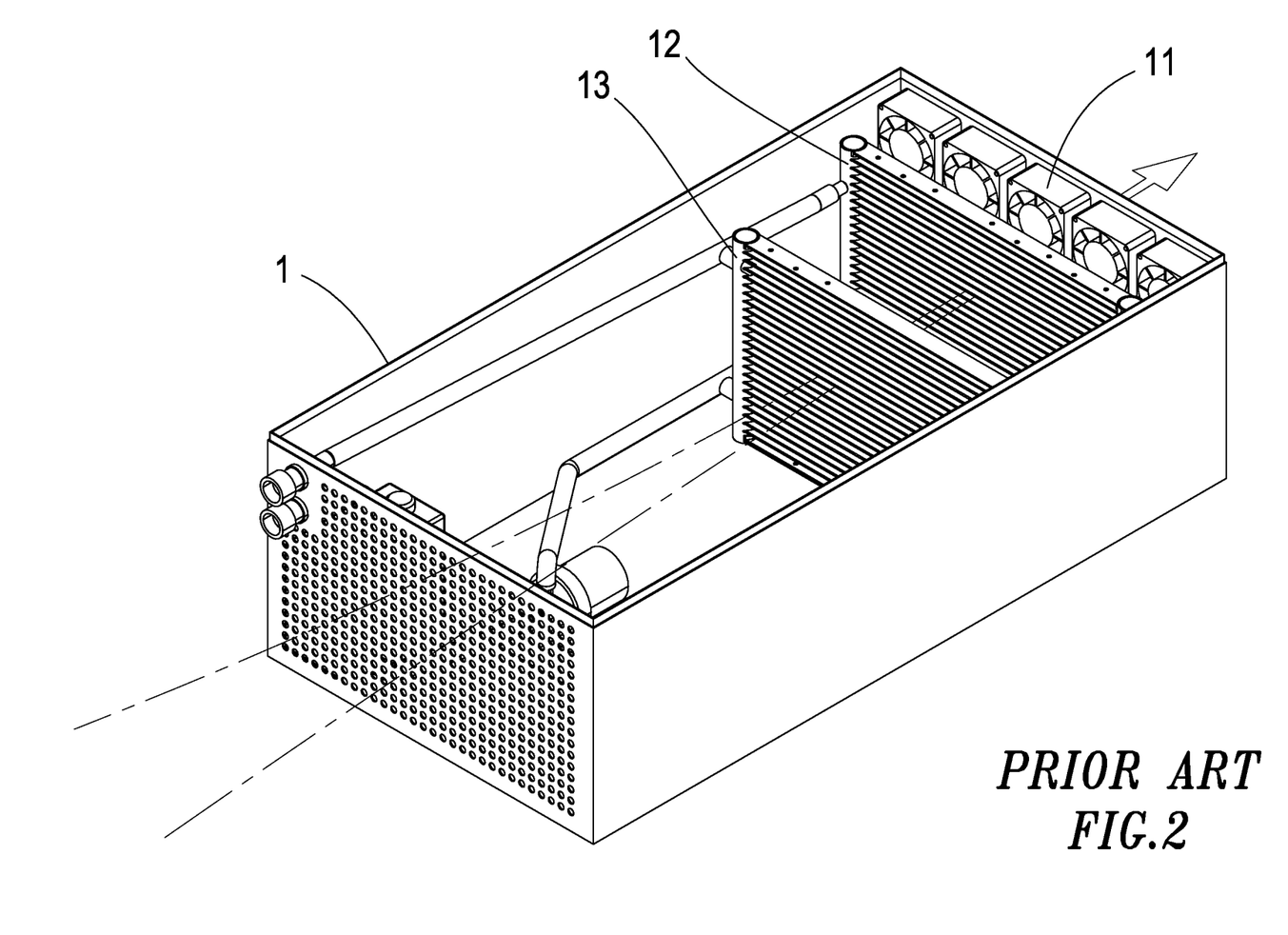
FIG. 2 is another perspective view of a conventional heat dissipation device.

Liquid is used as a heat dissipation medium to circulate in the form of cold and heat exchange. The liquid with a relatively low temperature absorbs heat energy when it flows through an electronic component with a relatively high temperature, and then conducts heat exchange in a cooling device to release the heat energy. Please refer to the FIG. 1 which is the device commonly known as CDU (coolant distribution unit). The liquid absorbing heat energy enters a case 1 equipped with a plurality of fans 11 through the pipeline, and then enters a first heat dissipation device 12 through the pipeline and is discharged at the other end. The fans 11 is used to let the wind enter the case1 from the outside and then be discharged, and the wind in the case 1 will pass through the first heat dissipation device 12, and take away the heat energy to achieve cooling effect. Please refer to FIG. 2, there is a second heat dissipation device 13 next to the first heat dissipation device 12, and the cooling effect is accelerated by two sets of heat dissipation devices. The heat dissipation device12 and the second heat dissipation device 13 have limited space for interior decoration. Currently, they are both horizontally parallel to each other. However, when the wind passes from the second heat dissipation device 13, the temperature will increase, and the increased temperature will then pass through the first heat. When emitting device 12, the heat dissipation effect will be reduced, resulting in a decrease in the overall heat dissipation effect.

Therefore, the heat dissipation device and pipeline configuration in the case 1 are redesigned so that the heat dissipation effect is not affected, and a plurality of heat dissipation devices can be configured to improve the heat dissipation effect. This is the solution of the heat dissipation device of server cabinet of the present invention.

SUMMARY OF THE INVENTION

The present invention provides a heat dissipation device of server cabinet, comprising at least: an outer case, the outer case is provided with a plurality of vent holes on one side, a plurality of fans are installed on the other side of the outer case, and a water inlet end and a water outlet end are respectively installed on the outer case, the water tank and a water pump are respectively installed in the outer case, the water inlet end is connected with a water inlet pipe, and the water outlet end is connected with a water outlet pipe; and a plurality of heat dissipation devices are installed in the outer case, an included angle is located between each of the heat dissipation devices, the included angle is set towards the direction of each vent hole or the direction of each fan, each of the heat dissipation devices has a water inlet part and a water outlet part respectively, the water inlet pipe is connected to the water tank and the water pump in sequence in the outer case, and is connected to the water inlet part of each of the heat dissipation devices, the water outlet pipe is divided and connected to the water outlet part of each heat dissipation device, the water inlet part is fixed with a plurality of first fins, and the water outlet part is fixed with a plurality of second fins, the first fin is connected to one end of each of the second fins, and a plurality of air ducts are formed between each of the first fins and each of the second fins.

In a preferred embodiment, wherein the heat dissipation device is arranged in a V-shaped, inverted V-shaped, W-shaped or M-shaped arrangement in the outer case.

In a preferred embodiment, wherein the heat dissipation device is provided with two, and is installed in the outer case in a V-shaped or inverted V-shaped arrangement, and an included angle is formed between the two heat dissipation devices, and the included angle is an intermediate between 30° and 160°.

In a preferred embodiment, wherein the heat dissipation device is provided with four, and the W-shaped or M-shaped arrangement is installed in the outer case, and an included angle is formed between the two heat dissipation devices, and the included angle is between 30° and 160°.

In a preferred embodiment, wherein the water inlet part and the water outlet part are located on different sides of the heat dissipation device.

In a preferred embodiment, wherein the water inlet part and the water outlet part are located on the same side of the heat dissipation device.

In a preferred embodiment, wherein one end of each of the first fins and each of the second fins is connected through a communicating part.

In a preferred embodiment, wherein the water inlet part and the water outlet part of each of the heat dissipation devices are respectively formed into one piece, and the water inlet part and the water outlet part are separated by a separator, thereby restricting the direction of water flow.

In a preferred embodiment, wherein each of the first fin and each of the second fins are formed in a flat shape.

In a preferred embodiment, wherein each of the fans is installed on the other side opposite to each of the vent holes.

In a preferred embodiment, wherein the water inlet end and the water outlet end are installed on the same side as each of the vent holes.

DETAILED DESCRIPTION OF THE INVENTION

The term "on" used to describe the position of the structure disclosed in the content of the present specification refers to any surface position of the structure, and is not commonly referred to as "above" or "upper surface" with a directionality. The terms "above" and "below" used to describe the position of a structure refer to the directionality of the position of the structure under conventional usage.

The terms "fixed" or "installed" used to describe the combination of structures disclosed in the content of the present specification generally refer to a plurality of structures that will not be easily separated or dropped after being combined. It can be a detachable connection or an integrally formed connection; it can be a mechanical connection or an electrical connection: it can be a direct physical connection or an indirect connection through an intermediate medium, and it can be the internal connection of two components, for example: the use of threads, tenons, fasteners, nails, adhesives or any combination of high frequency.

The term "forming" used to describe the combination of structures disclosed in the content of the present specification generally refers to one of the structures or multiple structures being combined into the same body during manufacture, or the same body due to different positions, shapes and the corresponding structure generated by the different functions.

Other technical contents, features and effects of the present invention will be clearly presented in the following detailed description of the preferred embodiments with reference to the drawings.

Figure 3:
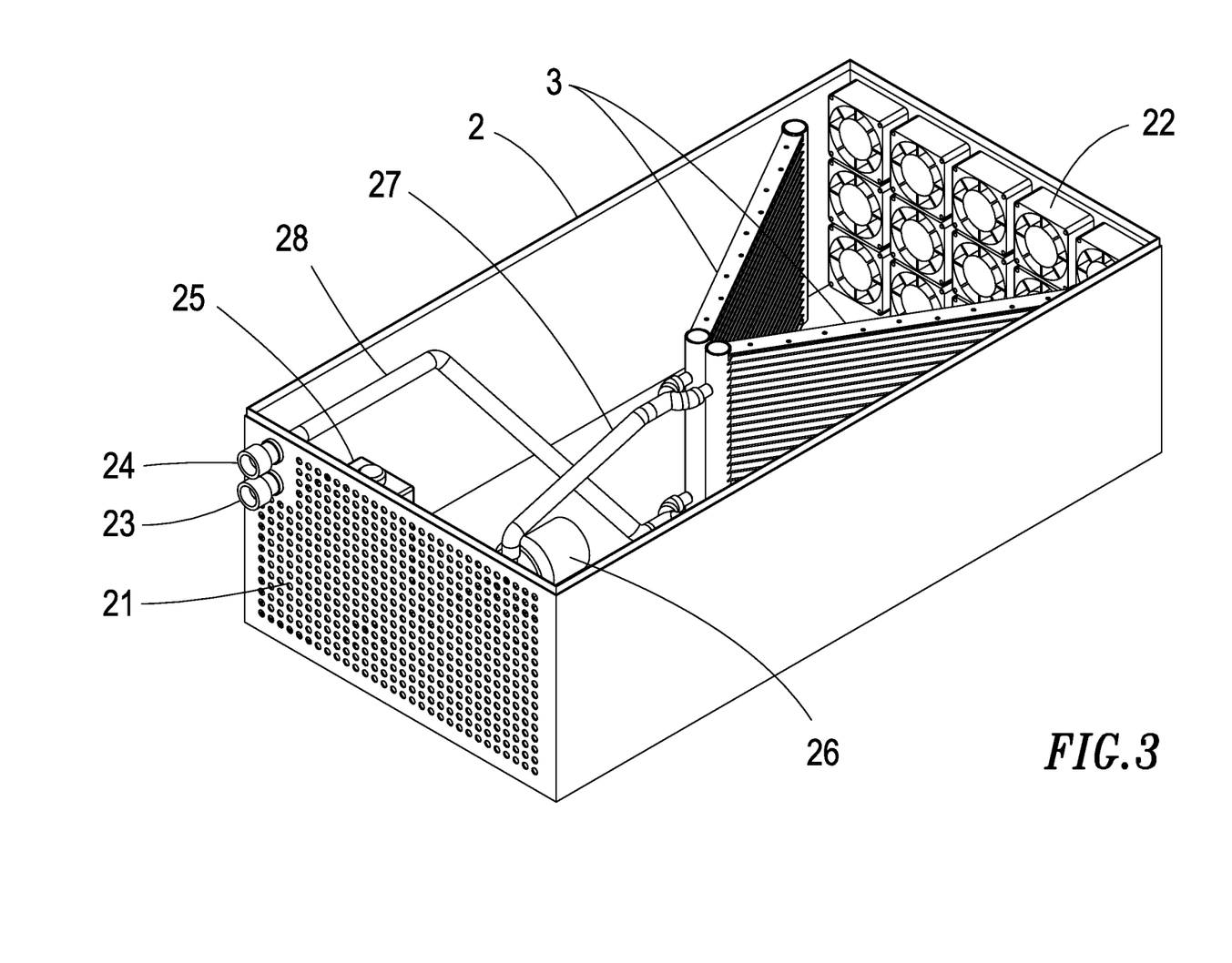
FIG. 3 is a three-dimensional schematic diagram of the structure of the first embodiment of the heat dissipation device of server cabinet of the present invention.
Figure 4:
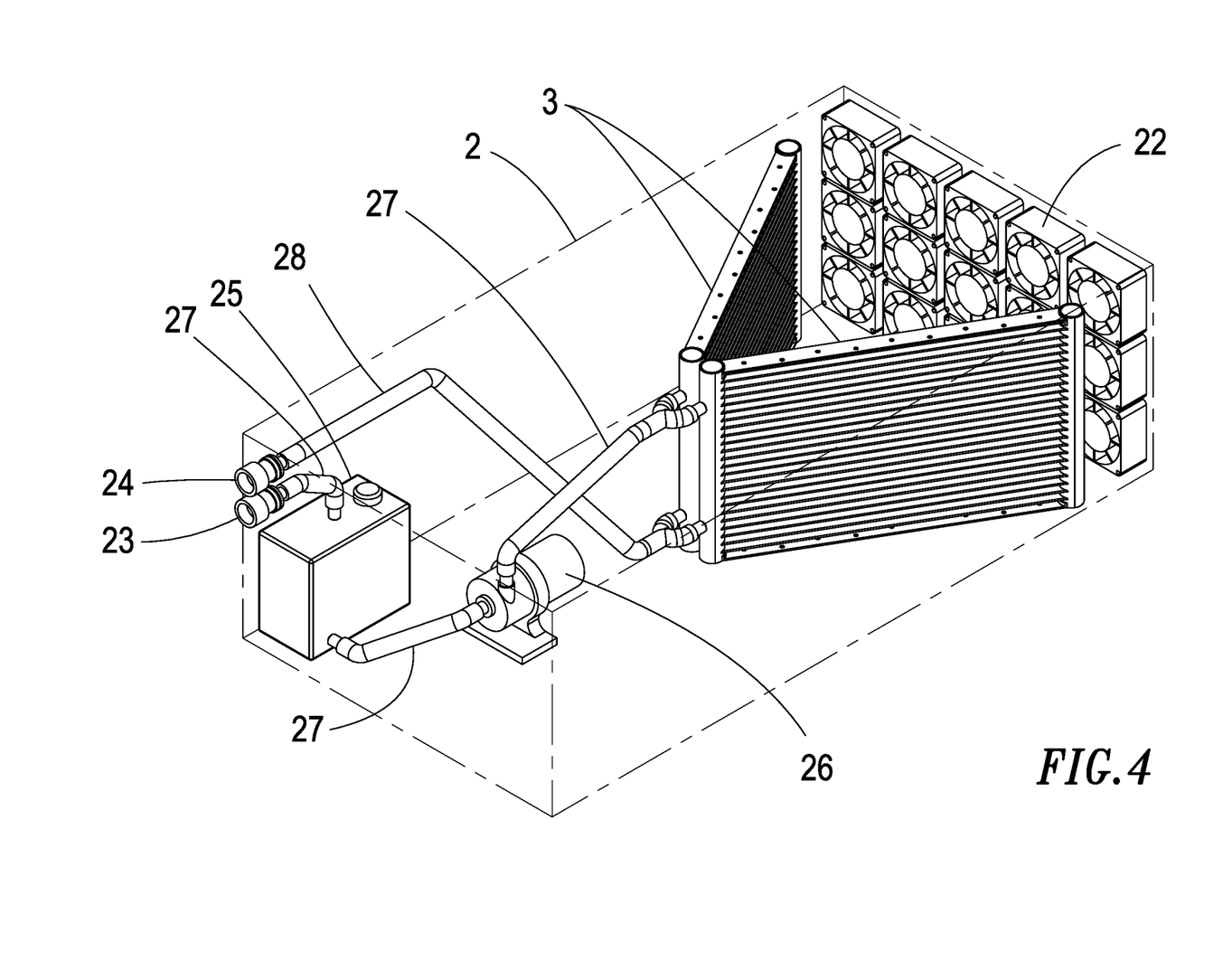
FIG. 4 is a three-dimensional schematic diagram of the structure of the first embodiment of the heat dissipation device of server cabinet of the present invention.
Figure 5:
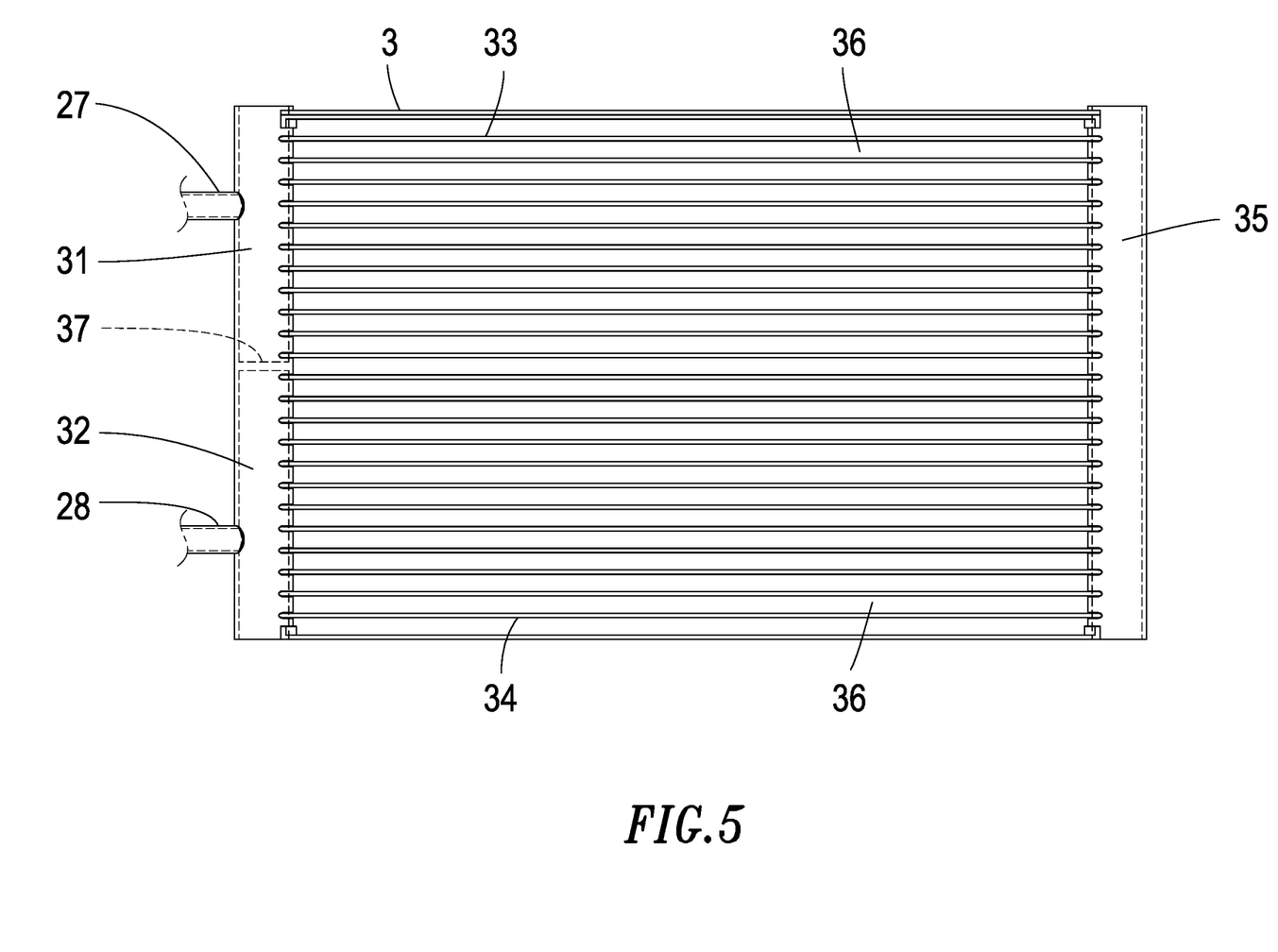
FIG. 5 is a schematic structural diagram of the heat dissipation device of the heat dissipation device of server cabinet of the present invention.
Figure 6:
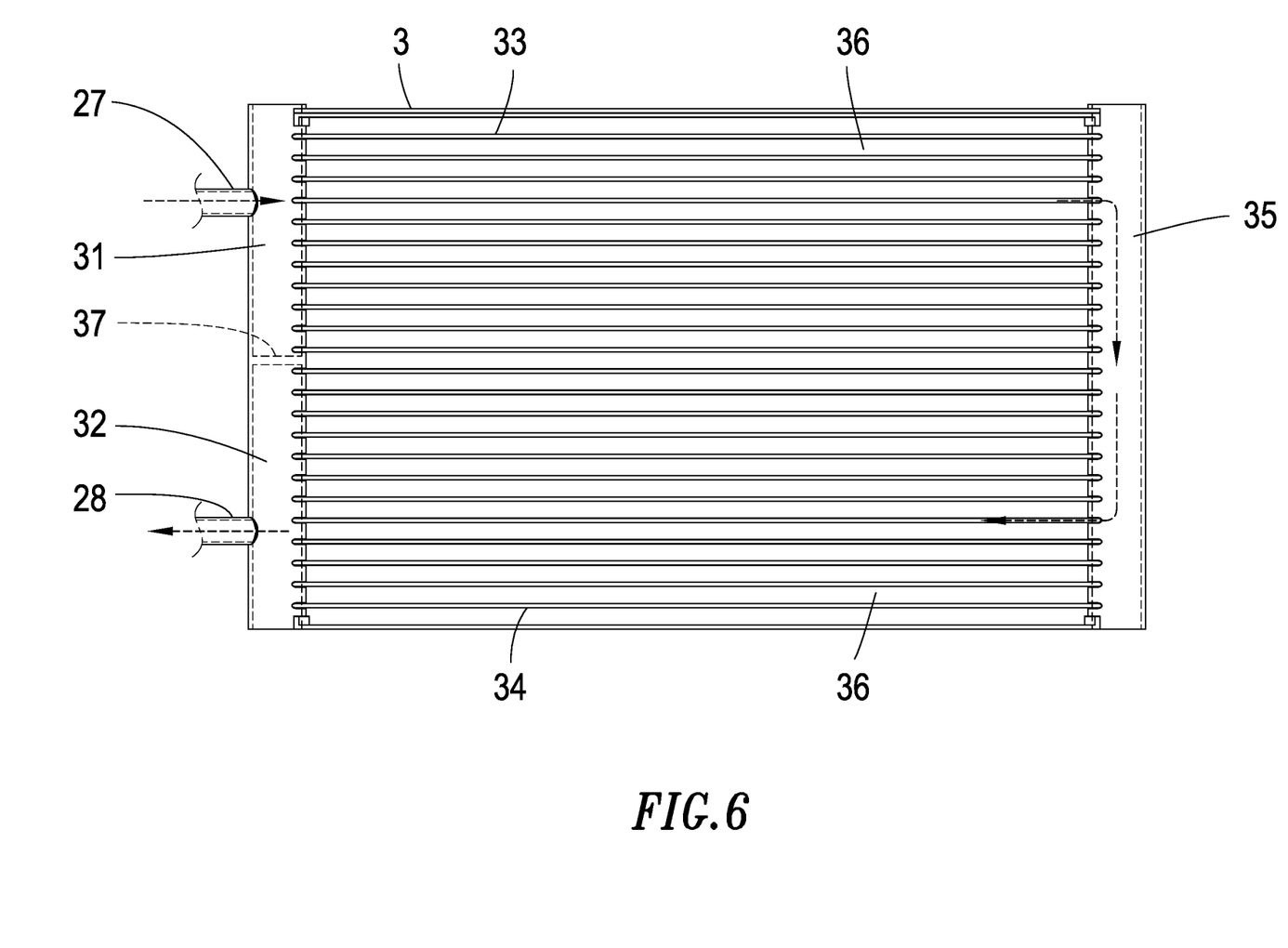
FIG. 6 is a schematic diagram of heat dissipation device implementation of heat dissipation device of server cabinet of the present invention.
Figure 7:
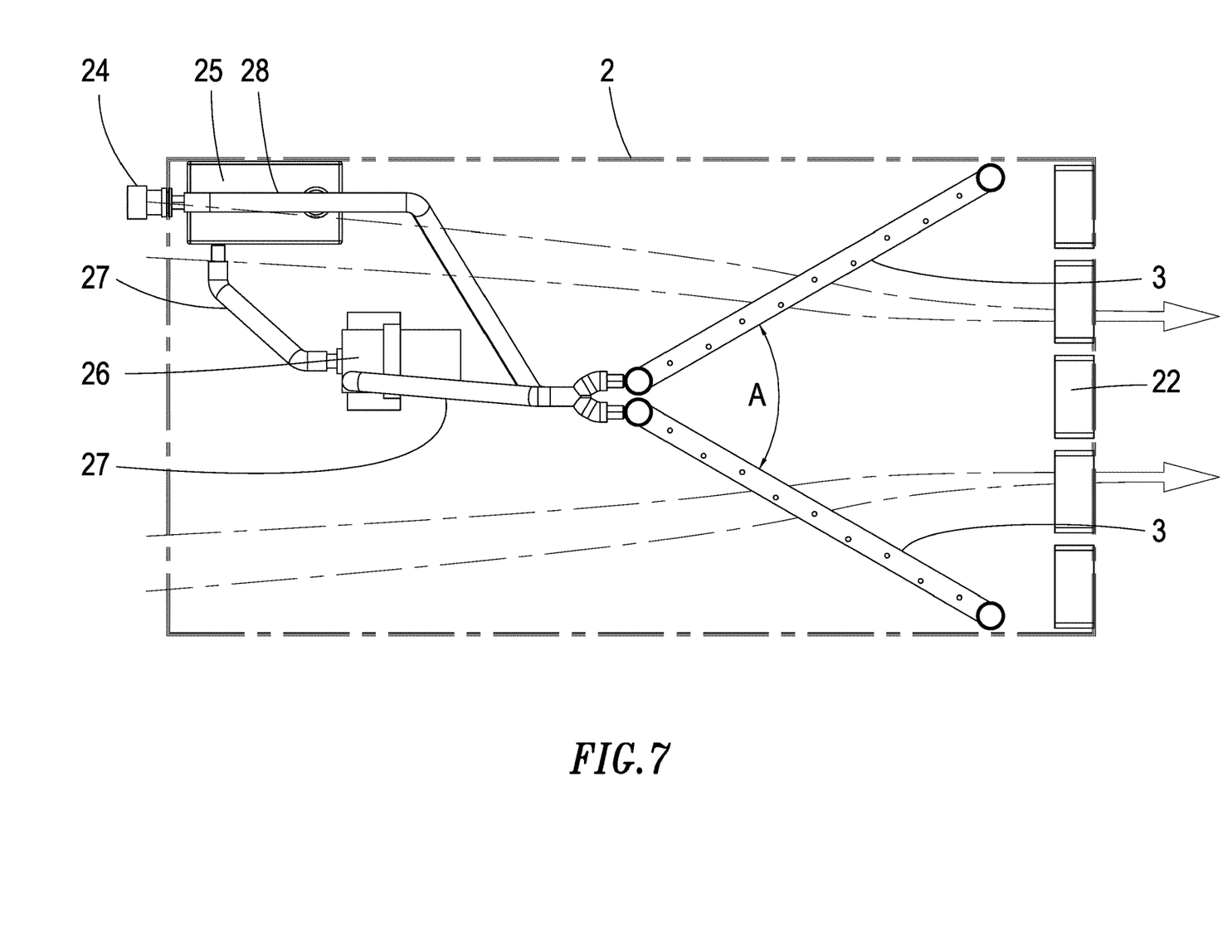
FIG. 7 is a schematic plan view of the implementation of heat dissipation of the first embodiment of the heat dissipation device of server cabinet of the present invention.

Please refer to FIG. 3 to FIG. 5, it is the first embodiment of the present invention, and its structure at least includes an outer case 2 and two heat dissipation devices 3 as shown in the figure:

Wherein, the outer case 2 is provided with a plurality of vent holes 21 on one side thereof, a plurality of fans 22 are installed on the other side of each of the vent holes 21, and are installed on the same side with each of the vent holes 21. There is a water inlet end 23 and a water outlet end 24, a water tank 25 and a water pump 26 are respectively installed in the outer case 2, the water inlet end 23 is connected to a water inlet pipe 27, and the water outlet end 24 is connected to an outlet pipe 28;

Wherein two of the heat dissipation devices 3 are installed in the outer case 2, and each of the heat dissipation devices 3 has a water inlet part 31 and a water outlet part 32 located on the same side respectively, and a plurality of first fin 33 are fixed on the water inlet part 31, a plurality of second fin 34 are fixed on the water outlet part 32, each of the first fin 33 and one end of each of the second fin 34 are connected through a communicating part 35, a plurality of air ducts 36 are formed between each of the first fin 33 and each of the second fin 34;

Please refer to FIG. 4, FIG. 6 and FIG. 7, the water inlet pipe 27 is connected to the water tank 25 and the water pump 26 in sequence in the outer case 2, and is connected to the water of each of the heat dissipation devices 3 of the inlet part 31, the water outlet pipe 28 is divided and connected to the water outlet part 32 of each of the heat dissipation devices 3. When the high temperature water enters from the water inlet end 23, it will preferentially enter the water tank 25 and then be pumped out by the water pump 26, and all the way through the water inlet pipe 27 into each of the water inlet parts 31 respectively, the high-temperature water in each of the water parts 31 is redistributed into each of the first fins 33, and the high-temperature water in each of the first fins 33 enters the After the communicating part 35, it is shunted into each of the second fins 34, and then enters the water outlet part 32 together and is brought out through the water outlet end 24, because each of the first fin33 and each of the second fin 34 provide more heat dissipation contact area, after the high temperature water flows into each of the first fin 33 and each of the second fin 34 respectively, the thermal energy can be quickly exported, and each of the air ducts 36 can take away the thermal energy through the wind:

The First Embodiment

Please refer to FIG. 6 and FIG. 7, in the first embodiment, the cooling system is implemented to exhaust the air in the outer case 2 after each fan 22 is activated, and the outside air is entered by each of the vent holes 21, so that the continuously entering air can be discharged. All are discharged through each of the air ducts 36, thereby forming the flow of the wind, which further takes away the thermal energy that is derived in each of the first fin 33 and each of the second fin 34. In this embodiment, two of the heat dissipation devices 3 are collected. The V-shaped arrangement is installed in the outer case 2, and an included angle A is formed between the two heat dissipation devices 3, and the included angle A is set toward the direction of each of the vents holes 21, so each wind is at After passing through each of the air ducts 36, it is discharged directly towards the direction of each of the fans 22 to ensure that each wind has no temperature difference and is discharged after passing through each of the air ducts 36 for the first time. That is, after each fan 22 is activated, the air outside the outer case 2 can be sucked in reversely, and then discharged through each vent hole 21 after passing through each air duct 36, which can also achieve the same effect.

Figure 8:
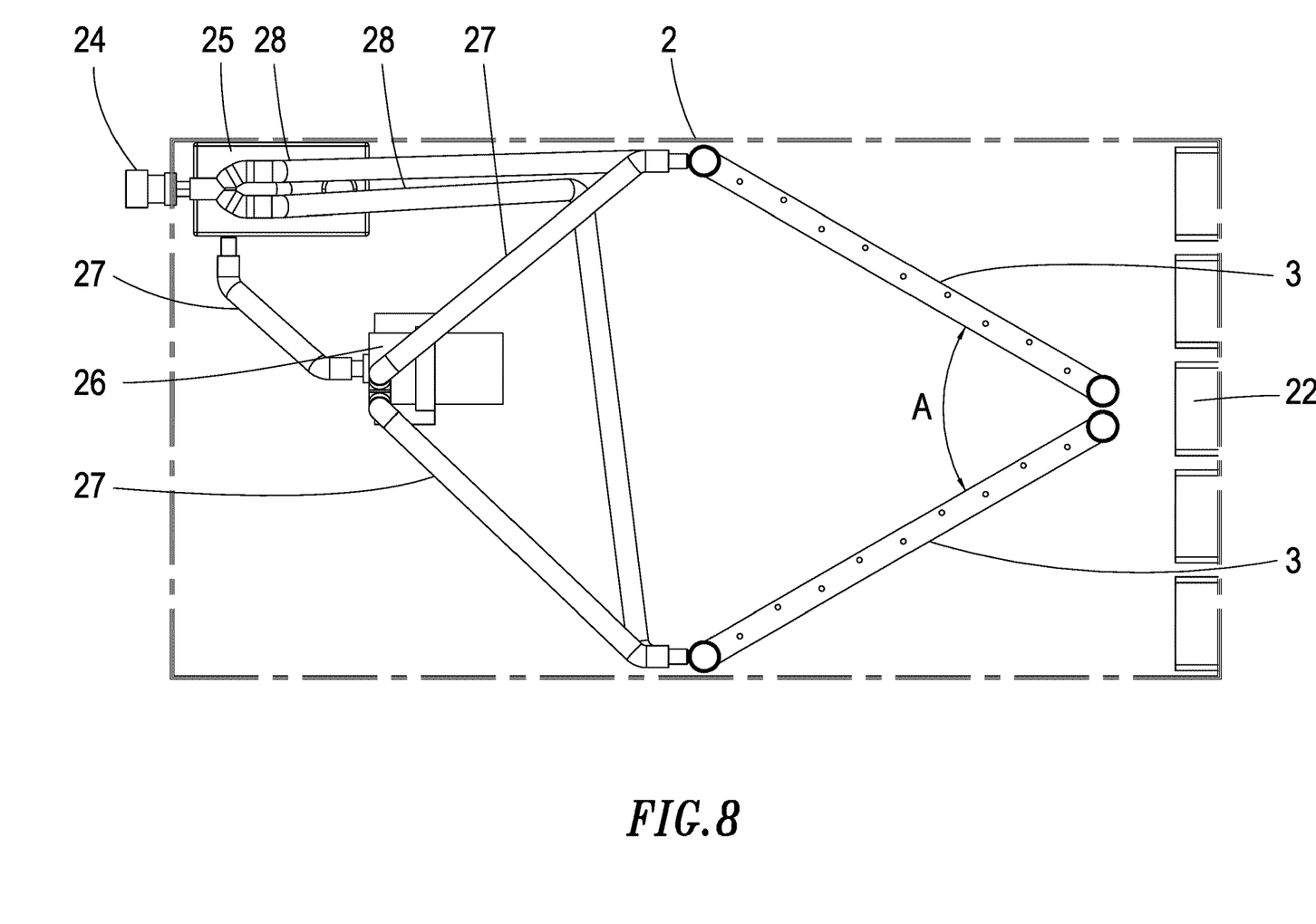
FIG. 8 is a schematic plan view of the structure of the second embodiment of the heat dissipation device of server cabinet of the present invention.

Please refer to the FIG. 5 and FIG. 8, as shown in the figure, it is the second embodiment of the present invention, and its structure includes at least one outer case 2 and two heat dissipation devices 3:

The Second Embodiment

Compared with the first embodiment, in this embodiment, two of the heat dissipation devices 3 are installed in the outer case 2 in an inverted V-shaped arrangement (or M-shaped), so that there are a included angle A are formed between the two heat dissipation devices 3. Each included angle A is set towards the direction of the fan 22. Therefore, after passing through each of the air duct 36, each wind is emitted toward the direction of each of the fans 22. It is also ensured that each wind has no temperature difference and is emitted after passing through each of the air duct 36 for the first time.

Figure 9:
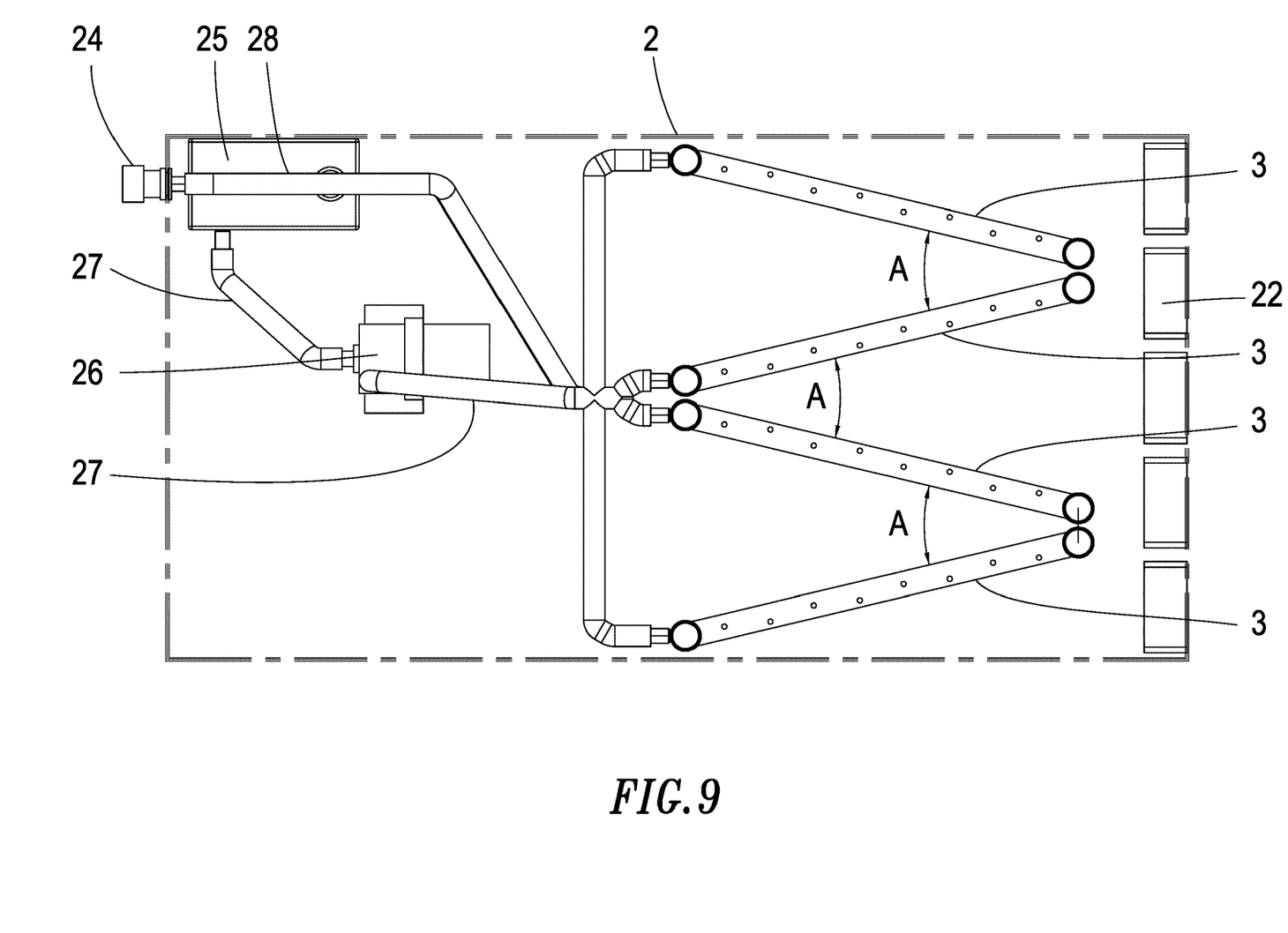
FIG. 9 is a schematic plan view of the structure of the third embodiment of the heat dissipation device of server cabinet of the present invention.

Please refer to FIG. 5 and FIG. 9, the third embodiment of the present invention is shown in the figure, and the structure includes at least one outer case 2 and four heat dissipation device 3:

The Third Embodiment

Compared with the first or the second embodiment, in this embodiment, two of the heat dissipation devices 3 are installed in the outer case 2 in an inverted V-shaped arrangement (or M-shaped), so that there are a plurality of included angles A are formed between the four heat dissipation devices 3. Each included angle A is set towards the direction of the vent hole 21 or the direction of the fan 22. Therefore, after passing through each of the air duct 36, each wind is emitted toward the direction of each of the fans 22. It is also ensured that each wind has no temperature difference and is emitted after passing through each of the air duct 36 for the first time.

Please refer to the FIG. 7 to FIG. 9, the first embodiment, the second embodiment and the third embodiment as mentioned above, the included angle A is different between ~0°, 9°~16° (including 33°, 35°, 40°), 45°, 50°, 55°, 60°, 65°, 70°, 75°, 80°, 85°, 90°, 95°, 100°, 105°, 110°, 115°, 120°, 125°, 130°, 135°, 140°, 145°, 150°, 155° and 160°).

Please refer to the FIG. 5, the first embodiment, the second embodiment and the third embodiment as mentioned above, each of the water inlet parts 31 and each of the water outlet parts 32 are formed in one piece: the water inlet part 31 and the water outlet parts 32 is separated by a separator 37 to limit the direction of water flow.

Please refer to the FIG. 4 and FIG. 5, the first embodiment, the second embodiment and the third embodiment as mentioned above, the first fin 33 and the second fin 34 are are arranged in parallel, in addition, the flat and wider surface is set parallel to the flow direction of the wind, so as to reduce the wind resistance and increase the heat dissipation contact area.

For the heat dissipation device of server cabinet provided by the present invention, please refer to FIG. 4, FIG. 5 and FIG. 7. When more than one heat dissipation device 3 is configured, each heat dissipation device 3 is configured at a specific angle, so that each heat dissipation device 3 does not overlap on the path of wind circulation, which ensures that each wind will not be affected by other heat dissipation devices 3, so there is no significant temperature difference between each wind. When compared with other conventional technologies, it has significant advantages such as stabilizing the overall heat dissipation temperature to make the heat dissipation effect better.

Figure 10:
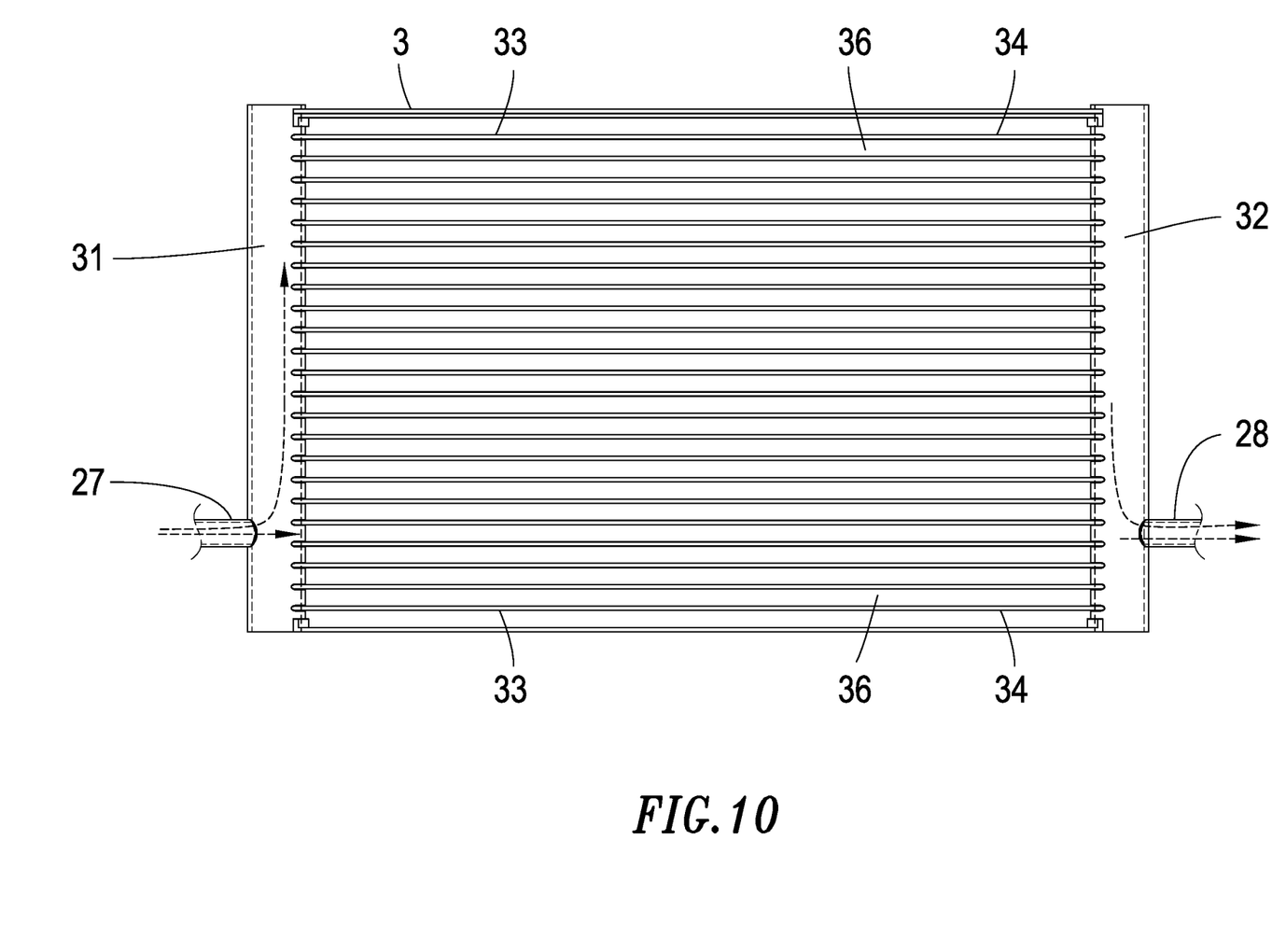
FIG. 10 is a schematic diagram of another embodiment of the heat dissipation device structure of the heat dissipation device of server cabinet of the present invention.

The heat dissipation device of server cabinet provided by the present invention, please refer to FIG. 10, which discloses another embodiment of the heat dissipation device 3. The heat dissipation device 3 is installed in the outer case 2, and each of the heat dissipation device 3 is installed in the outer case 2. The heat dissipation device 3 has a water inlet part 31 and a water outlet part 32 located on different sides respectively, a plurality of first fins 33 are fixed on the water inlet part 31, and a plurality of second fins 34 are fixed on the water outlet part 32, and each of the first fins 34 is fixed on the water outlet part 32. The fin 33 is connected to one end of each of the second fins 34, and a plurality of air ducts 36 are formed between each of the first fins 33 and each of the second fins 34.

The above-detailed description is a specific description of a feasible embodiment of the present invention, but this embodiment is not intended to limit the patent scope of the present invention. Any equivalent implementation or modification that does not depart from the technical spirit of the present invention shall be included within the scope of the patent in this case.

What is claimed is:

1. A heat dissipation device of server cabinet, comprising at least:
    an outer case, the outer case is provided with a plurality of vent holes on one side, a plurality of fans are installed on the other side of the outer case, and a water inlet end and a water outlet end are respectively installed on the outer case, a water tank and a water pump are respectively installed in the outer case, the water inlet end is connected with a water inlet pipe, and the water outlet end is connected with a water outlet pipe; and
    a plurality of heat dissipation devices are installed in the outer case, an included angle is located between each of the heat dissipation devices, the included angle is set towards the direction of each vent hole or the direction of each fan, each of the heat dissipation devices has a water inlet part and a water outlet part respectively, the water inlet pipe is connected to the water tank and the water pump in sequence in the outer case, and is connected to the water inlet part of each of the heat dissipation devices, the water outlet pipe is divided and connected to the water outlet part of each heat dissipation device, the water inlet part is fixed with a plurality of first fins, and the water outlet part is fixed with a plurality of second fins, wherein one end of each of the first fins and one end of each of the second fins are connected through a communicating part, and a plurality of air ducts are formed between each of the first fins and each of the second fins.

2. The heat dissipation device of server cabinet of claim 1, wherein each of the heat dissipation devices is arranged in a V-shape, an inverted V-shape, a W-shape or an M-shape and is arranged in the outer case.

3. The heat dissipation device of server cabinet of claim 1, wherein the included angle is between 30°~160°.

4. The heat dissipation device of server cabinet of claim 1, wherein the water inlet part and the water outlet part are located on different sides of the heat dissipation device.

5. The heat dissipation device of server cabinet of claim 1, wherein the water inlet part and the water outlet part are located on the same side of the heat dissipation device.

6. The heat dissipation device of server cabinet of claim 5, wherein the water inlet part and the water outlet part of each of the heat dissipation devices are respectively formed into one piece, and the water inlet part and the water outlet part are separated by a separator.

7. The heat dissipation device of server cabinet of claim 1, wherein each of the first fin and each of the second fins are formed in a flat shape.

8. The heat dissipation device of server cabinet of claim 1, wherein each of the fans is installed on the other side opposite to each of the vent holes.

9. The heat dissipation device of server cabinet of claim 1, wherein the water inlet end and the water outlet end are installed on the same side as each of the vent holes.

* * * * *